(12) United States Patent
Umotoy et al.

(10) Patent No.: US 7,705,275 B2
(45) Date of Patent: Apr. 27, 2010

(54) SUBSTRATE SUPPORT HAVING BRAZED PLATES AND RESISTANCE HEATER

(75) Inventors: Salvador P. Umotoy, Antioch, CA (US); Lawrence Chung-Lai Lei, Milpitas, CA (US); Gwo-chun Tzu, Sunnyvale, CA (US); Xiangxiong (John) Yuan, San Jose, CA (US); Michael S. Jackson, Sunnyvale, CA (US); Hymam Lam, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 208 days.

(21) Appl. No.: 11/506,460

(22) Filed: Aug. 17, 2006

(65) Prior Publication Data

US 2007/0040265 A1   Feb. 22, 2007

Related U.S. Application Data

(60) Provisional application No. 60/709,397, filed on Aug. 17, 2005.

(51) Int. Cl.
*A21B 1/22* (2006.01)
(52) U.S. Cl. .................... 219/401; 156/345.48
(58) Field of Classification Search ................ 257/704; 438/121; 219/401, 402; 156/345.51, 345.52, 156/345.53, 345.48
See application file for complete search history.

(56) References Cited

U.S. PATENT DOCUMENTS

| | | | |
|---|---|---|---|
| 5,738,165 A | 4/1998 | Imai | |
| 5,854,468 A | 12/1998 | Muka | |
| 6,032,997 A | 3/2000 | Elliot et al. | |
| 6,035,101 A * | 3/2000 | Sajoto et al. | ................ 392/416 |
| 6,094,334 A | 7/2000 | Bedi | |
| 6,310,755 B1 | 10/2001 | Kholodenko | |
| 6,490,146 B2 | 12/2002 | Wang | |
| 6,503,368 B1 * | 1/2003 | Kholodenko et al. | ... 156/345.51 |

(Continued)

FOREIGN PATENT DOCUMENTS

EP     0734053     *  9/1996

(Continued)

OTHER PUBLICATIONS

Machine Translation of JP 2005109091 Apr. 2005 Japan Yoshinori and Shinichi.*

(Continued)

*Primary Examiner*—Steven Loke
*Assistant Examiner*—Kimberly M Thomas
(74) *Attorney, Agent, or Firm*—Ashok K. Janah

(57) ABSTRACT

A substrate support comprises top, middle and bottom plates which are brazed together. The top plate has a top surface with a plurality of outwardly projecting mesas dispersed across a recessed pocket, a network of recessed grooves, a vacuum port terminating in the recessed grooves, and plurality of gas ports. The middle plate has a plurality of middle feedthroughs aligned to corresponding top feedthroughs of the top plate, and the bottom plate has a plurality of bottom feedthroughs aligned to the middle feedthroughs of the middle plate. The top and middle plates are joined by a first brazed bond layer and the middle and bottom plates are joined by a second brazed bond layer.

13 Claims, 5 Drawing Sheets

U.S. PATENT DOCUMENTS

| | | |
|---|---|---|
| 6,538,872 B1 | 3/2003 | Wang |
| 2002/0189940 A1 | 12/2002 | Tsai et al. |
| 2004/0212947 A1 | 10/2004 | Nguyen |
| 2005/0219786 A1 | 10/2005 | Brown |

FOREIGN PATENT DOCUMENTS

| | | | |
|---|---|---|---|
| JP | 2005-109091 | * | 4/2005 |
| JP | 2005-109091 A | | 4/2005 |
| WO | WO-99/49501 A2 | | 9/1999 |
| WO | WO-2007/022471 A3 | | 6/2007 |

OTHER PUBLICATIONS

Oberle, T, PCT International Preliminary Report on Patentability, PCT App. No. PCT/US2006/032501, Feb. 20, 2008, Rijswijk NL.

Lee, G. N., Office Action dated Sep. 29, 2009, Korean Appl. No. 10-2008-7004421 entitled "Substrate support having brazed plates and resistance heater" (KR).

SIPO—P.R. China, Office Action dated Jul. 10, 2009, Chinese Application No. 200680030168.0 entitled "Substrate support having brazed plates and resistance heater".

* cited by examiner

SUBSTRATE SUPPORT HAVING BRAZED PLATES AND RESISTANCE HEATER

The present application is claiming benefit of U.S. Provisional Application No. 60/709,397, filed on Aug. 17, 2005 which is incorporated by reference herein and in its entirety.

BACKGROUND

Embodiments of the present invention relate to a substrate support for holding a substrate in a substrate processing chamber.

In the fabrication of electronic circuits and displays, semiconductor, dielectric, and electrically conducting materials are formed on a substrate, such as for example, a semiconductor wafer, ceramic or glass substrate. The materials are formed for example, by chemical vapor deposition (CVD), physical vapor deposition (PVD), ion implantation, oxidation, nitridation and other such processes. Thereafter, the deposited substrate materials can be etched to form features such as gates, vias, contact holes and interconnect lines. These processes are typically carried out in a process chamber, as for example described in commonly assigned U.S. Pat. No. 6,491,978, to Kalyanam et al., which is incorporated herein by reference in its entirety. In such processes, the substrate is placed on a substrate support and exposed to a process zone in the chamber. The support often includes a heater to further regulate the temperatures of the substrate during processing. A plasma is typically formed in the process zone by inductively or capacitively coupling energy to a process gas, or by coupling microwaves to a process gas, and this plasma processes the substrate to deposit or etch material on the substrate.

As the dimensional requirements for the layers and features formed on the substrate being increasingly smaller, the temperature uniformity across the substrate has to become more and more uniform and with narrower allowable ranges of temperatures across the substrate. For example, in CVD processes, temperature variations across the substrate surface can result in the deposition of a CVD layer having varying thickness. The tolerance range for such thickness variations becomes ever smaller as the deposited layer becomes thinner. Similarly, in etching processes different etching rates across the substrate can result in the etching of features having different shapes or sizes across the substrate. Thus it is desirable for the substrate support to minimize temperature variations across the substrate that can result in processing anomalies.

The ever-tighter temperature ranges needed across the surface of the substrate during processing is difficult to achieve with conventional supports. One conventional support comprises a chuck formed of aluminum, stainless steel, or ceramic, that has a substrate receiving surface, various vacuum ports and purge or heat transfer gas conduits, and underlying support plates. The metal pedestal and underlying support plates are welded together so that welding butt joints positioned across the surface of a plate contact an adjacent plate. In one embodiment, an electron beam is then focused on a welding butt joint to weld the butt joint to an adjacent plate. However, such conventional supports often fail to provide the desired narrow temperature range across the substrate because the electron beam weld butt joints positioned around the gas and vacuum conduits are often not smoothly or continuously welded to one another. This causes vacuum pressure or purge/heat transfer gas leakage from these joints resulting in non-uniform temperatures across the substrate. The welding process also often induces localized stresses in the plates after assembly which causes the support to warp or buckle after a number of process cycles. Warping of the plates resulting in gaps between the plates that have varying thicknesses or spacing resulting in uneven heat transfer rates from the overlying substrate and through the underlying support plates.

Another problem with conventional supports arises from their heater and vacuum port configurations. Typically, a single vacuum port is used on the support surface to hold the substrate, and this provides an uneven or even weak vacuum chucking pressure across the backside of the substrate. As a result, the substrate is more likely to pop-out when there is a fluctuation in backside pressure caused by leakage of vacuum pressure from welded joints along the vacuum path in the support. Also, excessive suction force immediately adjacent to the single port can cause the substrate to warp during processing. An improperly held substrate can also have temperature variations arising from regions having poor contact or gaps with the underlying support. Supports with built-in resistance heater elements which are not properly positioned between the plates further results in non-uniform heat applied to the overlying substrate, resulting in asymmetrical processing across the substrate.

Thus it is desirable to have a substrate support capable of maintaining the substrate at uniform and consistent temperatures and within a tight range. It is also desirable to have vacuum and gas ports and conduits that minimize loss of vacuum pressure during processing, uneven vacuum force on the substrate, and leakage of gas from joints. It is further desirable to have heaters that apply a uniform heat load to the substrate during processing.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
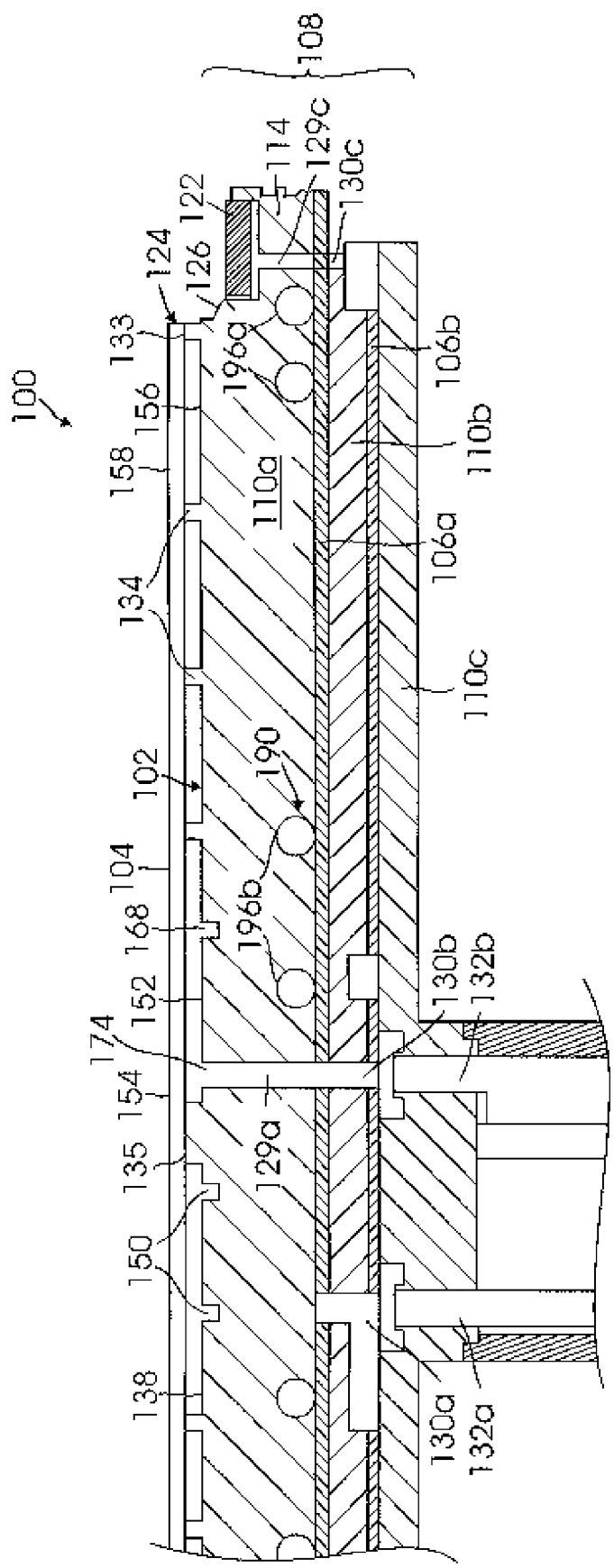
FIG. 1A is a schematic sectional side view of a support showing the assembled plates which are brazed together and which has a substrate-receiving surface with vacuum grooves and contact mesas.
Figure 1B:
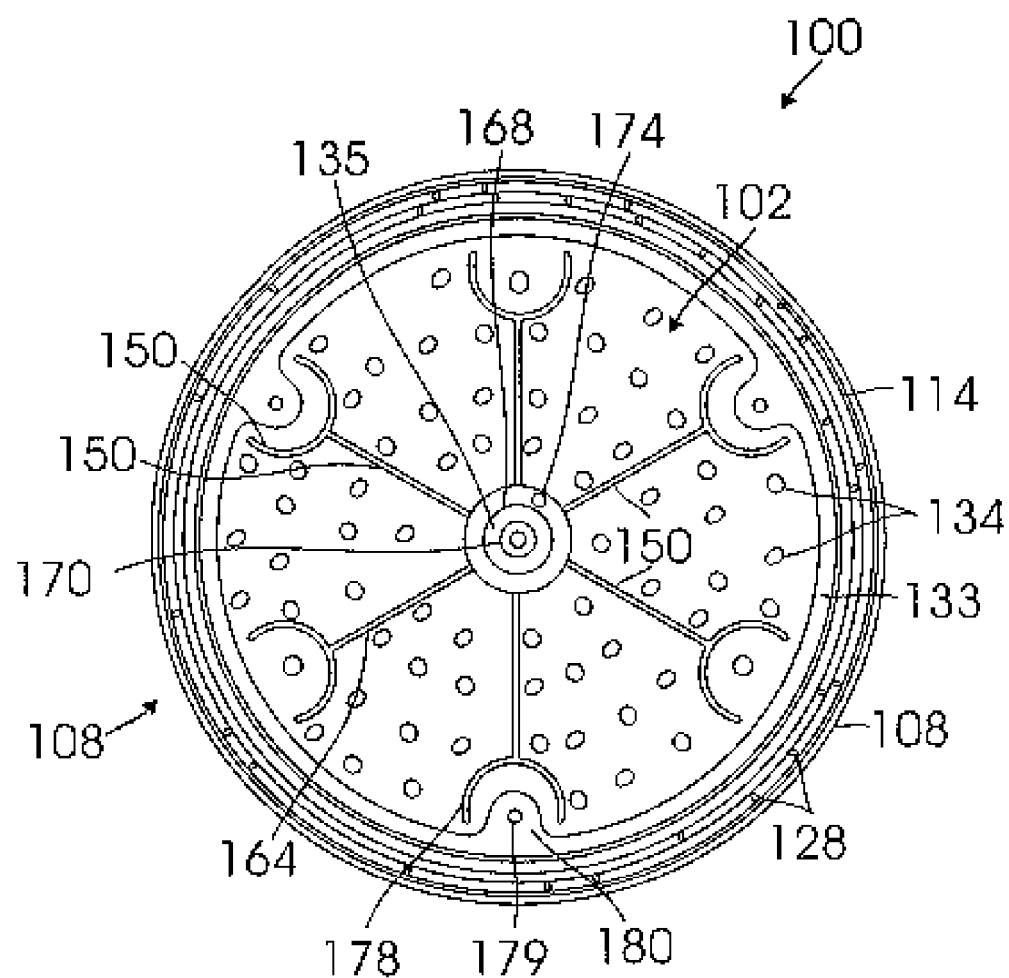
FIG. 1B is a top view of the support of FIG. 1A showing the pattern of vacuum grooves and mesas on the top surface of the support.

An exemplary embodiment of a substrate support 100 comprising a substrate receiving surface 102 to support a substrate 104, is schematically illustrated in FIGS. 1A and 1B. The substrate support 100 comprises a pedestal 108 made from a plurality of plates 110, for example, a top plate 110a, middle plate 110b and bottom plate 110c. The plates 110a-c and their interfaces control the rates of heat transfer to and from the substrate 104. The top plate 110a, middle plate 110b and bottom plate 110c are shaped and sized to match the shape of the substrate 104. For example, in one version, when the substrate 104 is a semiconductor wafer, the top plate 110a is a disc with a right cylindrical shape, and the middle plate 110b and bottom plate 110c are also right cylindrical shapes. While an exemplary version comprising top, middle and bottom plates 110a-c is used to illustrate the substrate support 100, other versions having fewer or additional plates can also be used, as would be apparent to those of ordinary skill in the art. Also, the plates 110a-c can have cross-plates which are non-planar, for example, with recesses and ridges (not shown) that mate with one another to form a unitary pedestal 108. Therefore, the present invention should not be limited to the illustrative embodiments described herein.

The pedestal 108 also comprises a peripheral ledge 114 which extends about the substrate-receiving surface 102 and serves to receive a perimeter ring 122, which deflects the gas provided under the ring about the perimeter of the substrate 104 to control deposition about the peripheral region 124 of the substrate 104. The transition between the substrate receiving surface 102 and the peripheral ledge 114 comprises a chambered corner 126 which is arcuate shaped to reduce the erosion susceptibility of the edge in plasma environments. The ring 122 is typically sized about to have a diameter which is about 2 to about 10% larger than the diameter of the substrate 104 received on the substrate receiving surface 102. The gas, such as helium, nitrogen, or even a reactive gas is provided about the peripheral ledge 114 of the support 100 through a plurality of gas ports 128 which terminate at the peripheral ledge, to control deposition or processing rates of the peripheral edge 124 of the substrate. For example, the gas can be provided to purge deposition gas from the peripheral region 124 of the substrate 104 to prevent deposition of material on the backside and edge of the substrate 104. The gas can also be provided for other reasons, for example to control deposition rates for deposition quality at the perimeter edge of the substrate. The gas ports 128 are connected via feedthroughs 129, 130,132 to an external gas source (not shown). For example, the ports 124 can be connected to one or more top, middle and bottom feedthroughs 129, 130a-c and 132, in the top plate 102a, middle plate 110b, and bottom plate 110c, respectively. The feedthroughs 129, 130a-c and 132 are aligned to one another and serve to provide gas, supply a vacuum pressure, or allow electrical connections to the plates 110a-c. The gas ports 128 have diameters which are sufficiently small to reduce plasma glow discharges of the gas in these holes.

The receiving surface 102 is the top surface of the top plate 110a and it includes various projections and recesses. The surface 102 includes a sealing rim 133 that extends around the perimeter of the surface 102, and which directly contacts the substrate 104 placed on the surface 102 to form a peripheral seal around the surface 102. The surface 102 also has a plurality of outwardly projecting mesas 134 and central raised steps 135 near a central region of the surface 102. The surface 102 further comprises a recessed pocket 138 which is a lower planar portion surrounded by the sealing rim 133. The recessed pocket 138 forms a gap between the backside of substrate 104 and the support 100. The sealing rim 133, mesas 134, and raised central step 135, raise and support the substrate 104 to reduce the contact area of the top surface 102 with the backside of the substrate 104. The reduced contact area reduces the hot spots that can form at these contact regions during processing of the substrate 104 in a process chamber.

The mesas 134 are spaced apart from one another and dispersed about the surface 102 in the recessed pocket 133. In the version shown, the mesas 134 are generally arranged in concentric rings, although they can be also aligned along radial lines or even be asymmetrically arranged. The number, spacing, size and overall patterns of the mesas 134 are selected to reduce hot spots on the surface 102. The height and spacing are also determined by the amount of vacuum holding force applied to hold the substrate 104; otherwise, the substrate 104 may cup or bow between the mesas 134. Generally the mesas 134 are cylinders; however, other shapes can also be used, for example, concave, triangular, or rectangular. The mesa shape and height can also selected to facilitate gas flow beneath the substrate 104, for example, by channeling the gas to particular regions below the substrate 104 or by tailoring the vacuum holding force to achieve good thermal conduction from the substrate 104 to the support 100. In one version, the mesas 134 are generally cylindrical.

The mesas 134 on the surface 102 are dispersed between a network of recessed grooves 150 that extend into the top surface. Generally, the top surface 102 comprises a central portion 152, which lies below a central region 154 of the substrate 104, and a peripheral portion 156 which is under a peripheral part 158 of the substrate 104. In one version, for example, the recessed grooves 150 comprise a plurality of spaced apart radial arms 164 that extend radially outward from the central portion 152 to the peripheral portion 156 of the top surface 102. At the central portion 152, the radial arms 164 terminate in a circular groove 168 which contains a vacuum port 174. The circular groove 168 is about a raised disc 170. The vacuum pressure provided through the vacuum port 174 disseminates through the circular groove 168 into the radial spaced apart arms 164. At the peripheral portion 156 of the top surface 102, the radial arms 164 terminate in a semi-circle groove 178. For example, the version shown has six radial arms 164 which are spaced apart by about 60° to cover the top surface 102. Each of the radial arms 164 terminates in its own semicircle groove 178 at the peripheral portion 156 of the surface 102. Each semicircle grove 178 surrounds a lift pinhole 179 which allows lift pin (not shown) to pass through the support 100 through the raised crescent region 180 which also serves to support the substrate and seal the lift pinhole 179.

The vacuum port 174 is connected through the feedthroughs 129a, 130b, 132b that pass through the top, middle and bottom plates 110a-c, respectively, to connect to a vacuum connector coupling (not shown) which in turn connects outside the chamber to one or more vacuum pumps. In assembly, the feedthroughs 129a, 130b, 132b are aligned to one another and sealed around their edges so that the vacuum pressure can flow through the plates 110a-c to reach the vacuum port 174 without excessive loss of pressure. Similarly, the gas port 128 is also connected to a plurality of aligned feedthroughs 129b, 130a, c, 132a which pass through the top plate 110a, middle plate 110b, and bottom plate 110c, respectively, and which are also aligned and sealed around their edges in fabrication. For example, the feedthroughs 129, 130, 132 can be aligned to one another and sealed by brazing compound applied around their edges.

A resistance heater 190 can also be positioned in one of the plates 110 before brazing of the plates to one another. The resistance heater 190 comprises an electrical resistance that generates heat upon application of a voltage across the resistance. The support 100 also comprises heater leads (not shown) that extend out of the pedestal 108 to conduct electrical power to the resistance heater 190. The amount of heat generated is related to the power applied to the resistance heater 190. The resistance heater 190 is desirably capable of maintaining the substrate 104 at temperatures of from about 200 to about 800° C. The resistance heater 190 comprises one or more resistive element 196 made from an electrically conducting material, such as a metal, for example, tungsten, molybdenum, molybdenum disilicide, iron, nickel, copper, Inconel™, or alloys and mixtures thereof. Molybdenum has a good thermal conductivity and resistance in corrosion in non-oxidizing environments. The heater leads conducting electrical power to the resistance heater 190 can comprise conductors such as molybdenum and nickel, which are passed through passages in the support 100.

The resistance heater 190 can also comprise more than one independently controllable first and second resistive heating elements 196a,b shaped to conform to the shape of the overlying substrate 104. In one version, the resistive heating elements 196a,b comprise wires that form a pattern of concentric circles (not shown) which cover an area corresponding in shape and size to that of the overlying substrate 104. As another example, the resistive heating elements 196a,b comprises a mesh of electrically conducting wire (not shown) extending below substantially the entire substrate 104.

Figure 4:
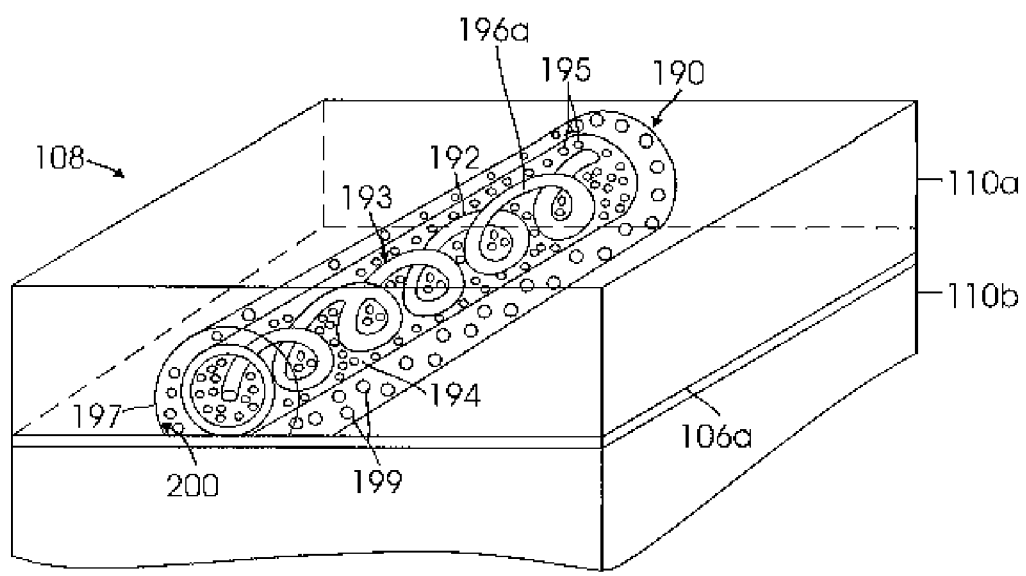
FIG. 4 is a schematic perspective view of two brazed plates with a resistance heater comprising a resistive heating element in a tube filled with an electrical insulator, and with a thermally conductive powder between the tube and the surrounding groove of the plate.

In yet another version, as shown in FIG. 4, the resistive heating elements 196a,b comprise a cylindrically electrically resistive wire 192 which is coiled form a spiral 193 and inserted into a hollow tube 194. The tube 194 is then filled with an electrical insulator powder 195, such as powdered magnesium oxide, to electrically insulate the coiled wire 192. The tube 194 containing the wire 192 is positioned in a groove 197 in one of the plates 110, for example, the underside of the top plate 110a. It has further been discovered that packing a powdered thermally conductive filler 199 in the spaces between and around the tube 194 and the surrounding groove 197 of the plate 110a, substantially improves the temperature uniformity provided by the resistance heater 190. It is believed that without the thermally conductive filler 199, the gaps and spaces where the tube does not contact, or improperly contacts the overlying or surrounding surface of the groove 197 resulting in large variations in heat transferred from the resistive heating elements 190a,b to the surrounding plate 110a. In one version, the thermally conductive filler 199 comprises a metal such as, for example, stainless steel particles. Further, optionally, the particles can include stainless steel powder mixed with a lower melting point or fluxing metal, such as nickel, indium, tin, lead, etc, to allow the particles to soften or liquefy in the brazing heat treatment described above to form a thermally conductive filler 199 that surrounds the tube 194 in the groove 197 of the plate 110a.

In one version, independently controllable resistive heating elements 196 provide independent heating at different regions of the support 100. For example, the resistive elements 196a,b can form at least two concentric loops at a central region 152 and a peripheral region 156 of the plate 110a of the support 100, as shown in FIG. 1A. In one embodiment, two independently controllable resistive heating elements 196a,b which each have an electrical resistance of between about 2.5 ohms to about 5 ohms can be used to provide separate heating of two spatially concentric zones of the top plate 110a. The two resistive heating elements 196a,b are each provided with separate heater leads (not shown) that extend down through the pedestal 108 to an external power supply (also not shown). The substrate support 100 may optionally comprise a plurality of thermocouples (not shown) the terminate near the substrate 104, or touching the substrate 104, to monitor the temperature at various regions of the support 100 and provide a basis for adjusting the power delivered to the independently heated zones.

Figure 3:
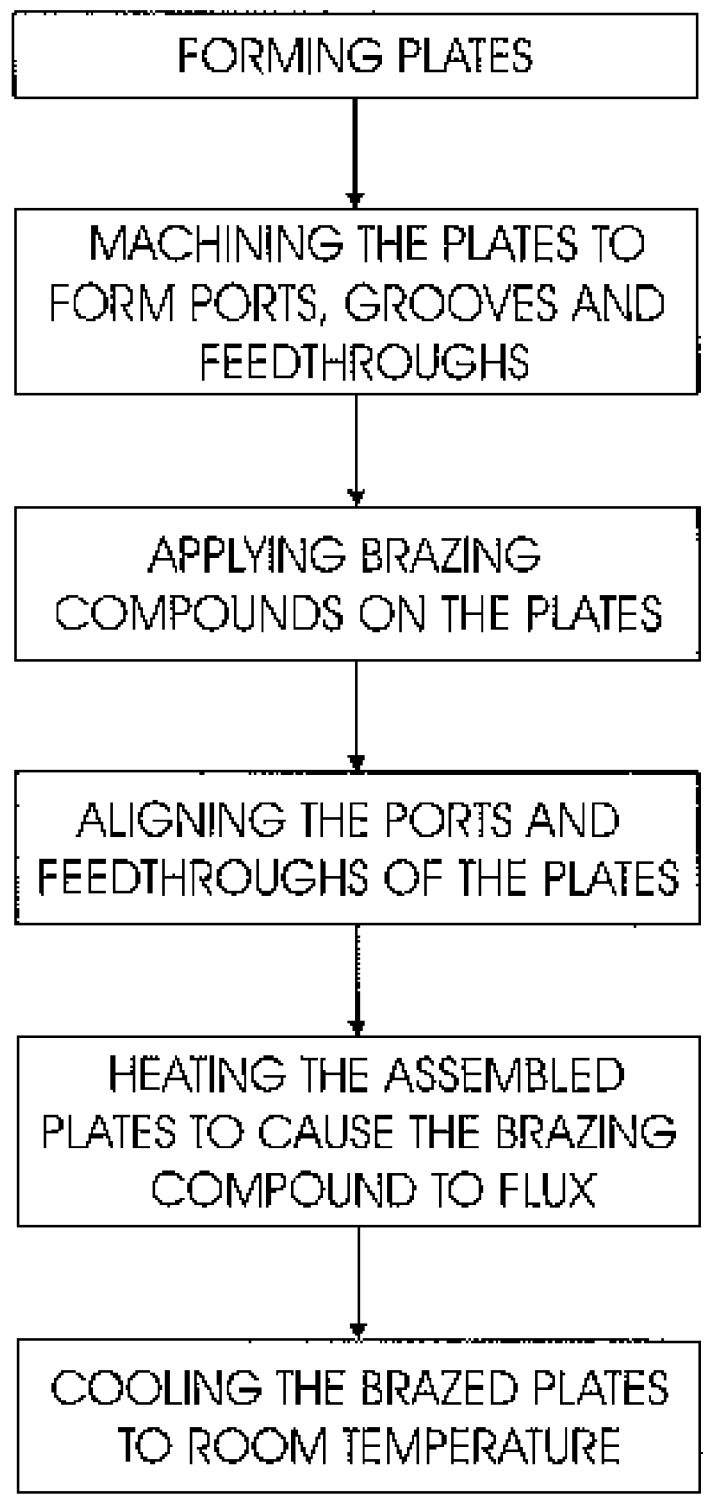
FIG. 3 is a flow chart showing a process to fabricate the support assembly.

An exemplary embodiment of a fabrication flow chart is illustrated in FIG. 3. In fabrication, the top, bottom and middle plates 110a-c, respectively, are fabricated from a metal, such as aluminum, anodized aluminum, stainless steel, iron, and commercially available alloys such as "HAYNES 242," "AI-6061," "SS 304," "SS 316," and INCONEL. In one version, the plates 110a-c are made from stainless steel by machining plate stock with conventional machining techniques to provide the desired grooves, mesa patterns, ports and feedthroughs, as illustrated in the flow chart of FIG. 3. For example, the plates 110a-c can be machined from stainless steel comprising SS-316. The plates 110 also comprise other holes which serve as the feedthroughs 129, 130, 132, holes for the heater leads, lift pins, thermocouples and other measurement, power supply or control leads. Conventional machining techniques include drilling, routing, milling and CMC machining. After machining, the plates 110 are cleaned to remove dirt and particles in a solvent, such as alcohol, for example in a vibrating ultrasonic bath.

Thereafter, brazing compound is applied to at least one surface of the three plates 110, typically an interface surface that will be joined to another interface surface on another plate 110, as shown in FIG. 3. Suitable brazing compounds should have a fluxing temperature lower than the melting point of the plates 110. For example, when the plates 110 are fabricated from stainless steel, the brazing compound is selected to have a fluxing temperature which is less than the melting temperature of stainless steel, for example, by at least 200° C. In fabrication, a slurry of brazing compound can be applied between the plates 110, or a thin sheet of brazing foil can be placed between the plates 110. The brazing compound typically comprises an alloy comprising at least one of aluminum, copper, indium, lead, magnesium, nickel, tin, silicon and their alloys thereof. For example, a suitable brazing compound comprises Cusin-1-ABA™, a brazing alloy paste which contains mostly silver and copper, and available from WESGO Inc., Belmont, Calif., which melts at 775° C. A suitable brazing foil comprises MBF-20 brazing foil, METGLAS™, which is a nickel based brazing foil containing boron, iron, silicon, chromium and cobalt, and which has a melting point of about 1000° C.

Figure 2:
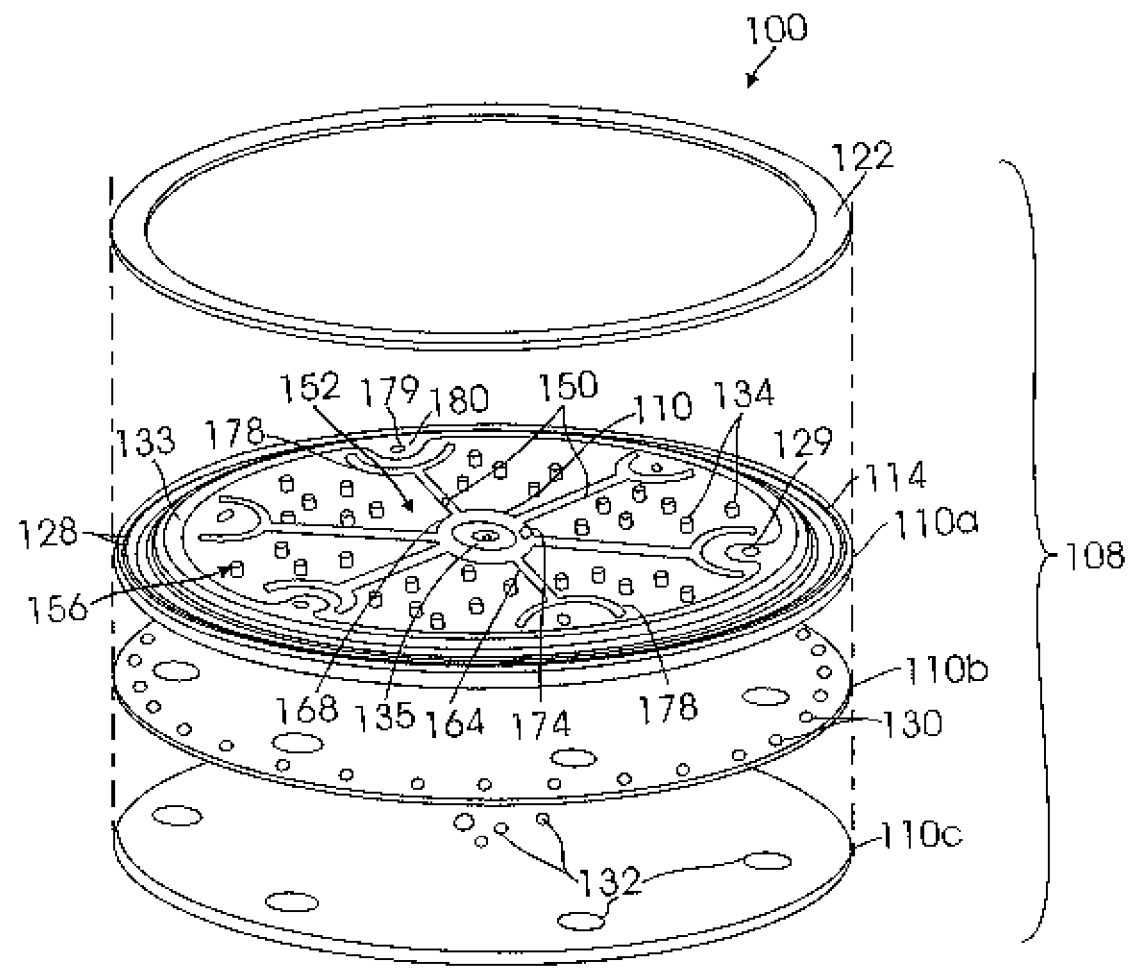
FIG. 2 is an exploded perspective view of the support of FIG. 1A showing three plates prior to assembly.

The plates 110 after being coated with brazing compound or having the brazing foil therebetween, are then aligned to one another to form an assembly such that the feedthroughs 129, 130 and 132, form continuous passages through the plates to the gas port 128 and vacuum port 174 on the top surface of the top plate 110a, and to supply power through electrical leads to the resistance heater 190 between the plates 110a-c. FIG. 2 shows the three plates 110a-c being aligned and prior to brazing. The assembly is then heated to allow the brazing compound to soften and react with the metal plates 110a-c on either side to form the first and second brazed bond layers 106a,b as shown in FIG. 1A. The assembly can be heated in a brazing oven or a brazing hot press while applying a suitable pressure to the assembly. The assembly of plates 110a-c is heated to a temperature sufficiently high to cause the brazing compound to flux and join the metal plates 110a-c. Thereafter, the brazed plates are cooled to room temperature to form a joined assembly that is the pedestal 108 of the support 100. Suitable brazing methods and materials are described in for example, commonly assigned U.S. Pat. No. 6,503,368 to Kholendenko et al., filed on Jun. 29, 2000; U.S. Pat. No. 6,583,980 to Wang et al., filed on Aug. 18, 2000; U.S. Pat. No. 6,490,146 to Wang et al., filed on Aug. 13, 2001; all of which are incorporated by reference herein in their entireties.

The coated support 100 of the top plate 110a is thus joined to the middle plate 110b by a first brazed bond layer 106a and the middle plate 110b is joined to the bottom plate 110c by a second brazed bond layer 106b. During substrate processing, there is generally a temperature differential between the plates 110a-c that arises from the heat generated in the plasma or from the electrical resistance heater 190 embedded in the pedestal 108. It has been discovered that bonding the plates 110a-c to one another by the brazed bond layers 106a,b significantly improves the thermal properties of the interface joints between the plates 110a-c as well as the thermal stability of the plate assembly, resulting in more uniform temperatures across the overlying substrate 104. Generally, during processing of a substrate 104, the plasma above the substrate heats up the substrate 104 and this thermal energy is dissipated through the substrate 104 and into the support 100. At the same time a resistance heater 190 can be powered to supply heat to the overlying substrate 104. A temperature gradient is established in the support 100 due to conduction of heat to and from the substrate 104 through the support 100. The temperature gradient may cause the different plates 110a-c of the support 100 to be at different temperatures during substrate processing resulting in thermal stresses across the plates 110a-c which can cause warping of the assembly.

The brazed bond layers 106a,b of the present assembly allow uniform heat transfer through the multiple plates 110a-c by reducing the variability of heat transfer interfaces between the different plates. In conventional electron beam welding methods, the gap between the plates resulted in non-uniform heat transfer rates through the plates and this is avoided in the present structure. In contrast, the brazed bond layers 106a,b provide a continuous planar layer between two adjacent plates 110a-c which presents a continuous thermal interface between the plates 110. The continuous thermal interface provides a homogenous medium for heat transfer. In the prior art electron beam welded models, the electron beam butt joints provide better heat transfer rates than surrounding non-joined areas, resulting in heat transfer gradients across the backside surface of the substrate 104. In contrast, the present brazed bond layers 106a,b provide a laminar junction with a uniform heat transfer impedance and consequently more uniform heat transfer rates.

Yet another advantage arises because the brazed bond layers 106a,b provide much better sealing of the vacuum and gas feedthroughs 129, 130, 132 passing through the plates 110a-c. As result, there is less vacuum pressure loss arising from leakage of vacuum at the interfaces between the plates 110a-c. Similarly, the brazing compound forms a tight seal around the gas feedthroughs 129, 130, 132, which reduces leakage of gas from these joints thereby preventing temperature instabilities on the overlying substrate 104.

A substrate support 100 according to the present invention allows meeting increasingly stringent process specifications, for example, a deposition thickness uniformity of about 3% (1σ) across the substrate 104 which is needed to support advances in integrated circuit and display fabrication. Such process specifications require more uniform temperatures to be maintained across the surface of the substrates. The present support 100 provides superior temperature uniformity and control by providing reduced contact area with the substrate 104 and having a gap between the substrate 104 and surface 102 of the support 100 which can hold a heat transfer gas that serves a thermal buffer to provide an even more uniform substrate temperature. The local hot or cool spots created by uneven temperatures of the resistance heater 190 or inconsistent heat conduction from the resistance heater 190 to the surrounding structure is made more uniform because of this thermal buffer. This allows substrates 104 to be heated with an almost flat thermal profile. In addition, the resistance heater 190 has dual heater elements 196a,b arranged in two zones, including a radially inner and outer zone. Separate control of the two zones allows the heat from first and second resistive heating elements 196a,b to be separately adjusted to further compensate for temperature variations across the substrate 104.

Furthermore, the recessed pocket 138 and the network of recessed vacuum grooves 150 on the top surface 102 also assist in maintaining a good thermal profile across the substrate 104 by ensuring that the vacuum force applied through the vacuum port 174 is evenly distributed evenly across the backside of the substrate 104. The vacuum port 174 ends in the circular groove 178 allowing the vacuum pressure or transfer across the entire backside of the substrate 104 through the pattern of grooves 150. In one version, the pattern of grooves 150 comprise a network of spaced apart grooves 150 that originate at an inner circular groove168 at the central portion 152 containing the vacuum port 174 and extend radially across the substrate to terminate in semicircular grooves 178 at the peripheral portion 156 of the support 100. This network of vacuum grooves 150 provides a uniform vacuum force to hold down the substrate 104 to prevent the substrate from slipping or popping out during the processing. Furthermore, because the substrate 104 is held down with a uniform clamping force across its entire backside surface, the substrate 104 makes better and more uniform thermal contact across the surface 102 of the support 100 to provide better thermal conduction between the substrate 104 and the support 100, thereby provide more uniform temperatures across the substrate 104.

Yet another feature that improves the temperature uniformity of the substrate 104 held on the support 100 comprises the multiple mesas 134 that extend upward from recessed pocket 138 on the top surface 102. The mesas 134 provide the actual contact surface that contacts and supports the substrate 104 to provide a controllable contact area that is actually in contact with the substrate 104 in relation to the non-contact area within the recessed pocket 138 of the surface 102. In one version, the mesas 134 number from about 10 to about 1000, or ever from 20 to 100, and have diameters sized from about 0.05 to 0.5 inches, or even about 0.10 inch. In one version, in the mesas 134 and sealing rim each have a surface flatness of, for example, from about 20 to about 100 microns, and a surface finish of from about 4 to about 20 microinches, to provide a uniform thermal contact interface with the bottom surface of the overlying substrate 104. The mesas 134 are particularly important when the substrate 104 has variability in flatness or is warped or bowed, and thus, may not be held down with a uniform force across the support 100. When the substrate is bowed, the mesas 134 in combination with the network of grooves 150 and pocket 138 allow the substrate 104 to be held down with sufficient force across the entire backside of the substrate 104 to flatten and hold the substrate.

The recessed pocket 138 between the mesas 134 have a depth in relation to contact area of the top surface of the mesas 134, and thus, provide a spaced apart gap region between bottom surface of the substrate 104 and the surface of the recessed pocket 138. It is been discovered that the variability in surface flatness or reflective shine of these recessed pocket 138 can also significant impact the temperature uniformity across the substrate 104. For example, highly reflective recessed pocket 134, or recessed pocket 134 that vary in reflective shine, can cause reduced or different rates of heat transfer from overlying portions of the substrate 104, respectively. In one version, the recessed pocket are roughened by bead blasting to provide a surface roughened recessed pocket 134 that reduce the variability in, or total amount, of their surface reflective, to achieve better new transfer rates across the substrate. A suitable surface roughness is from about 2 microns (10 microinch) to 80 microns (400 microinch) or even from about 4 microns (20 microinch) to about 16 microns (80 microinch). The depth of the recessed pocket 138 from a top surface of the mesas 134 is from about 25 microns (0.001 inch) to about 250 microns (0.010 mils).

It is also been determined that the ratio of the contact regions of the top surfaces of the mesas 134 to the non-contact area of the recessed pocket 138, can also be used to determine the power needed to power up the inner and outer resistive heating elements 196a,b of the resistance heater 190 to provide even more uniform temperature control of the substrate 104. Further, the present substrate support 100 also has a purge or reactive gas capability at its edge to prevent process deposition at the peripheral edge of the substrate 104, or to improve process characteristics at that region of the substrate 102 by tuning deposition at edge of substrates 104 by introducing gas or gasses that enhanced deposition or reduced deposition at edge of substrate.

The support 100 having the described combination of temperature control capabilities and deposition control features is unique and advantageous over conventional substrate supports. In a CVD process, it was determined that the support 100 provided a deposition layer having a thickness uniformity of 2.3 to 3.5%, compared to a deposition layer thickness uniformity of 5 to 7% achieved with conventional supports. This represents a one-fold to two-fold increase in deposition film uniformity achieved with the present substrate supports, which is an unexpected and surprising result.

While the present invention has been described in considerable detail with reference to certain preferred versions, many other versions should be apparent to those of ordinary skill in the art. For example, other sectional configurations or arrangements of the support 100 and its bond layers 106a,b should be apparent to those of ordinary skill in the art. The support 100 can be used in many types of chambers, including for example, CVD, PVD, ion implantation, RTD or other chambers. Therefore, the spirit and scope of the appended claims should not be limited to the description of the preferred versions contained herein.

What is claimed is:

1. A substrate support comprising:
   (a) a top plate of metal comprising
      (1) a top feedthroughs;
      (2) a top surface comprising:
         (i) a plurality of outwardly projecting mesas dispersed across a recessed pocket;
         (ii) a network of recessed grooves;
         (iii) a vacuum port terminating in the recessed grooves and connected to a top feedthrough; and
         (iv) a plurality of gas ports connected to another top feedthrough; and
      (3) a bottom surface comprising:
         (i) a groove;
         (ii) a resistance heater in the groove, the resistance heater comprising a first resistive heating element about a peripheral region of the metal plate and a second resistive heating element about a central region of the metal plate, each resistive heating element being in a tube surrounded by an electrical insulator powder; and
         (iii) a thermally conductive filler that surrounds the resistance heater and fills in the gap between the resistance heater and the groove;
   (b) a middle plate of metal comprising a plurality of middle feedthroughs which are aligned to the top feedthroughs of the top plate, the middle plate joined to the top plate by a first brazed bond layer comprising a metal alloy; and
   (c) a bottom plate of metal comprising a plurality of bottom feedthroughs which are aligned to the middle feedthroughs of the middle plate, the bottom plate joined to the middle plate by a second brazed bond layer comprising a metal alloy, and wherein the top, middle and bottom feedthroughs are sealed around their edges.

2. A support according to claim 1 wherein the first or second brazed bond layers comprises a brazing compound comprising at least one of aluminum, copper, indium, lead, magnesium, nickel, tin, silicon and their alloys thereof.

3. A support according to claim 1 wherein the top surface comprises a central portion and a peripheral portion, and the recessed grooves comprise a plurality of spaced apart arms that originate at a circular groove at the central portion which contains the vacuum port and extend radially across the substrate to terminate in semicircular grooves at the peripheral portion.

4. A support according to claim 1 wherein the mesas are substantially cylindrical.

5. A support according to claim 4 comprising from about 10 to about 1000 mesas.

6. A support according to claim 1 further comprising a sealing rim about the mesas.

7. A support according to claim 6 wherein the mesas and sealing rim each have a surface flatness of from about 20 to about 100 microns.

8. A support according to claim 1 wherein the recessed pocket comprises a surface roughness of from about 2 to about 80 microns.

9. A support according to claim 1 wherein a depth of the recessed pocket from a top surface of the mesas is from about 25 to about 250 microns.

10. A support according to claim 1 wherein the first and second resistive heating elements each comprise two concentric loops.

11. A support according to claim 10 wherein each resistive heating element is shaped as a spiral coil.

12. A support according to claim 1 wherein the top metal plate comprises
   (a) a recessed pocket comprising a surface roughness of from about 2 to about 80 microns; and
   (b) a sealing rim surrounding the recessed pocket, the mesas and the sealing rim each having a surface flatness of from about 20 to about 100 microns.

13. A support according to claim 1 wherein any one of the top, middle or bottom plate of metal comprises stainless steel.

\* \* \* \* \*